United States Patent
Hamilton et al.

(10) Patent No.: US 9,941,657 B2
(45) Date of Patent: Apr. 10, 2018

(54) PASSIVELY MODE-LOCKING SEMICONDUCTOR DISK LASER (SDL)

(71) Applicant: SOLUS TECHNOLOGIES LIMITED, Glasgow, West Scotland (GB)

(72) Inventors: Craig James Hamilton, Central Scotland (GB); Graeme Peter Alexander Malcolm, Central Scotland (GB)

(73) Assignee: SOLUS TECHNOLOGIES LIMITED, Glasgow (GB)

( * ) Notice: Subject to any disclaimer, the term of this patent is extended or adjusted under 35 U.S.C. 154(b) by 0 days.

(21) Appl. No.: 15/304,905

(22) PCT Filed: Apr. 20, 2015

(86) PCT No.: PCT/GB2015/051176
§ 371 (c)(1),
(2) Date: Oct. 18, 2016

(87) PCT Pub. No.: WO2015/159106
PCT Pub. Date: Oct. 22, 2015

(65) Prior Publication Data
US 2017/0187162 A1     Jun. 29, 2017

(30) Foreign Application Priority Data
Apr. 18, 2014   (GB) .................................. 1407015.5

(51) Int. Cl.
*H01S 3/06*  (2006.01)
*H01S 3/11*  (2006.01)
(Continued)

(52) U.S. Cl.
CPC .......... *H01S 3/1115* (2013.01); *H01S 3/0816* (2013.01); *H01S 3/0817* (2013.01);
(Continued)

(58) Field of Classification Search
CPC .... H01S 3/1115; H01S 3/1118; H01S 3/0816; H01S 3/0817; H01S 5/0245;
(Continued)

(56) References Cited

U.S. PATENT DOCUMENTS 6,735,234 B1   5/2004   Paschotta et al.
6,834,064 B1   12/2004  Paschotta et al.
(Continued)

FOREIGN PATENT DOCUMENTS

DE   10 2004 007 881 A1   9/2004
WO   WO 2013/003239 A1    1/2013
WO   WO 2013/152447 A2    10/2013

OTHER PUBLICATIONS

Hoogland et al., "Passively Mode-Locked Diode-Pumped Surface-Emitting Semiconductor Laser," IEEE Photonics Technology Letters, vol. 12, No. 9, Sep. 2000.

*Primary Examiner* — Kinam Park
(74) *Attorney, Agent, or Firm* — Nixon & Vanderhye P.C.

(57) ABSTRACT

A passively mode-locking laser and corresponding method is described. The laser comprises a resonator (2) terminated by first (3) and second (4) mirrors and folded by a third (5) and fourth (6) mirror. The third mirror comprises a reflector (14) surmounted by a multilayer semiconductor gain medium (15) including at least one quantum well layer while the second mirror (4) comprises an intensity saturable mirror. The resonator is configured to provide a cross sectional area of an intra cavity resonating field on the intensity saturable mirror that is greater than or equal to a cross sectional area of the intra cavity resonating field on the multilayer semiconductor gain medium. This arrangement provides a passively mode-locking laser that exhibits increased stability when compared to those systems known in the art.

13 Claims, 4 Drawing Sheets

(51) Int. Cl.

| | |
|---|---|
| *H01S 3/081* | (2006.01) |
| *H01S 5/024* | (2006.01) |
| *H01S 5/04* | (2006.01) |
| *H01S 5/14* | (2006.01) |
| *H01S 5/183* | (2006.01) |
| *H01S 5/343* | (2006.01) |

(52) U.S. Cl.
CPC ........ *H01S 3/1118* (2013.01); *H01S 5/02415* (2013.01); *H01S 5/02423* (2013.01); *H01S 5/02484* (2013.01); *H01S 5/041* (2013.01); *H01S 5/14* (2013.01); *H01S 5/18383* (2013.01); *H01S 5/34313* (2013.01); *H01S 2304/04* (2013.01)

(58) Field of Classification Search
CPC ........ H01S 5/02423; H01S 5/041; H01S 5/14; H01S 5/18383; H01S 5/34313; H01S 2304/04
See application file for complete search history.

(56) References Cited

U.S. PATENT DOCUMENTS

| | | | |
|---|---|---|---|
| 2004/0190567 A1* | 9/2004 | Lutgen | ................. H01S 3/1118 372/25 |
| 2009/0290606 A1 | 11/2009 | Chilla et al. | |
| 2013/0003761 A1 | 1/2013 | MacGillivray et al. | |
| 2015/0063390 A1* | 3/2015 | Hamilton | ................. H01S 3/086 372/45.01 |

* cited by examiner

PASSIVELY MODE-LOCKING SEMICONDUCTOR DISK LASER (SDL)

This application is the U.S. national phase of International Application No. PCT/GB2015/051176 filed 20 Apr. 2015 which designated the U.S. and claims priority to GB Patent Application No. 1407015.5 filed 18 Apr. 2014, the entire contents of each of which are hereby incorporated by reference.

The present invention relates to the field of semiconductor lasers and in particular to a semiconductor disc laser (SDL) configured to emit ultra short pulses of radiation.

BACKGROUND TO THE INVENTION

It is noted that SDLs are also known in the art as Vertical External Cavity Emitting Lasers (VECSELs) or Optically Pumped Semiconductor Lasers (OPSLs). Therefore the term semiconductor disc laser (SDL) when used throughout the present description is used to refer to each of these systems.

The term "ultra short" pulses as used within the following description refers to pulses having a duration from about 100 picoseconds (ps) down to a few femtoseconds (fs).

Ultra short pulses of optical radiation generated by laser sources are employed in a range of scientific, instrumentation and nonlinear optics applications. A well-known technique for generating short or ultra short pulse generation is mode locking. When mode locking takes place in a laser resonator a plurality of modes of the laser resonator are coupled in a phase-locked manner in such a way that the resulting generated electromagnetic field comprises a short pulse or cavity mode which circulates within the resonator. It can be induced by a temporal loss modulation which reduces the intracavity losses for a pulse within each cavity roundtrip time. This results in an open net gain window, in which pulses only experience gain if they pass the modulator within a particular time window.

The loss modulation can be formed either actively or passively. Active mode locking is achieved, for instance, using an acousto-optic modulator as an intracavity element, which is synchronised to the cavity roundtrip time. However, ultra short pulse generation relies on passive mode-locking techniques, because only a passive shutter is fast enough to shape and stabilise ultra short pulses. Passive mode locking generally relies on a saturable absorber mechanism, which produces decreasing loss with increasing optical intensity. When the saturable absorber parameters are correctly adjusted for the laser system, stable and self-starting mode locking can be achieved.

It is known in the art to employ a saturable Bragg reflector (SBR) to passively mode lock a solid state laser, see for example Tsuda et al "Mode-Locking Ultrafast Solid-State Lasers with Saturable Bragg Reflectors", IEEE Journal of Selected Topics in Quantum Electronics Vol. 2, No. 3, September 1996 pp. 454-463 and U.S. Pat. No. 5,627,854. An SBR is a nonlinear mirror that comprises one or more semiconductor quantum wells within a standard distributed Bragg reflector (DBR) i.e. a stack of alternating layers of quarter wave semiconductor materials. As result, the reflectivity, or absorption, exhibited by an SBR is intensity dependent i.e. the reflectivity is higher for higher light intensities. Femtosecond mode locking of resonators containing Ti:sapphire or Cr:LiCAF solid state gain mediums have been demonstrated employing these techniques.

US patent publication number 2004/0190567 and U.S. Pat. No. 6,735,234 B1 extend the above concepts so as to mode lock an SDL by incorporating a saturable Bragg reflector (SBR) within the resonator. U.S. Pat. No. 6,735,234 B1 discloses that during operation, a coupled cavity effect forms between the Bragg reflector of the SDL and Fresnel reflections from the front surface of the gain medium of the SDL. As this sub-cavity operates near resonance at the laser wavelength it acts to lower the effective gain saturation of the laser to a value well below the absorption saturation of the SBR. In order to compensate, and hence raise the gain saturation level of the device it is disclosed that the optical resonator design should be chosen to ensure that the cross sectional area of the intra cavity resonating field on the gain medium is larger than the cross sectional area of the intra cavity resonating field on the SBR.

In a number of scientific, instrumentation and nonlinear optics applications it is often desirable to obtain as stable a mode-locked laser output as possible. It is therefore recognised that it would be advantageous to provide a passively mode-locking semiconductor disc laser system that exhibits increased stability when compared to those passively mode-locking semiconductor disc laser systems known in the art.

SUMMARY OF THE INVENTION

According to a first aspect of the present invention there is provided a passively mode-locking laser comprising:

a resonator terminated by first and second mirrors and folded by third and fourth mirrors, the third mirror comprising a reflector surmounted by a multilayer semiconductor gain medium including at least one quantum well layer and the second mirror comprising an intensity saturable mirror, wherein the resonator is configured to provides a cross sectional area of an intra cavity resonating field on the intensity saturable mirror that is greater than or equal to a cross sectional area of the intra cavity resonating field on the multilayer semiconductor gain medium.

The above configuration provides a passively mode-locking, semiconductor disk laser (SDL) that exhibits increased stability when compared to those systems known in the art. The mode locking is a result of the intensity saturable mirror acting to clip the leading edges of the intracavity pulses or cavity modes. At the same time, the gain saturation effects introduced by the relative cross sectional area of the intra cavity resonating field on the intensity saturable mirror to that on the gain medium acts to clip the trailing edge of these intracavity pulses or cavity modes. Employing a larger cross sectional area of the intra cavity resonating field on the intensity saturable mirror has the additional advantage of increasing the reliability of this component and thus the overall stability of the laser.

The fourth mirror preferably has a concave radius of curvature.

The resonator may be additionally folded by a fifth mirror, the fifth mirror being located between the first and third mirrors. The fifth mirror preferably has a concave radius of curvature.

The first mirror preferably comprises an output coupler. The output coupler may be planar or have concave radius of curvature.

Optionally the laser comprises a continuous wave (cw) optical field source the output from which is configured to pump the gain medium. The (cw) optical field source may comprise a fibre coupled laser diode system.

Preferably the intensity saturable mirror comprises a saturable Bragg reflector (SBR).

Most preferably the laser provides an output field comprising ultra short pulses. The ultra short pulses may have a pulse width in the range of 100 ps to 100 fs.

According to a second aspect of the present invention there is provided a method of passively mode-locking a laser the method comprising
  providing a resonator terminated by a first mirror and a second mirror comprising an intensity saturable mirror;
  folding the resonator with a third mirror and fourth mirror, the third mirror comprising a reflector surmounted by a multilayer semiconductor gain medium;
  configuring the resonator to provide a cross sectional area of an intra cavity resonating field on the intensity saturable mirror that is greater than or equal to a cross sectional area of the intra cavity resonating field on the multilayer semiconductor gain medium.

The method of passively mode-locking a laser may further comprise folding the resonator by providing a fifth mirror between the first and the third mirrors.

The method of self mode locking a laser may further comprise providing a continuous wave (cw) optical field configured to pump the gain medium.

Embodiments of the second aspect of the invention may comprise features to implement the preferred or optional features of the first aspect of the invention or vice versa.

BRIEF DESCRIPTION OF THE DRAWINGS

There will now be described, by way of example only, various embodiments of the invention with reference to the drawings, of which.

DETAILED DESCRIPTION OF PREFERRED EMBODIMENTS

Figure 1:
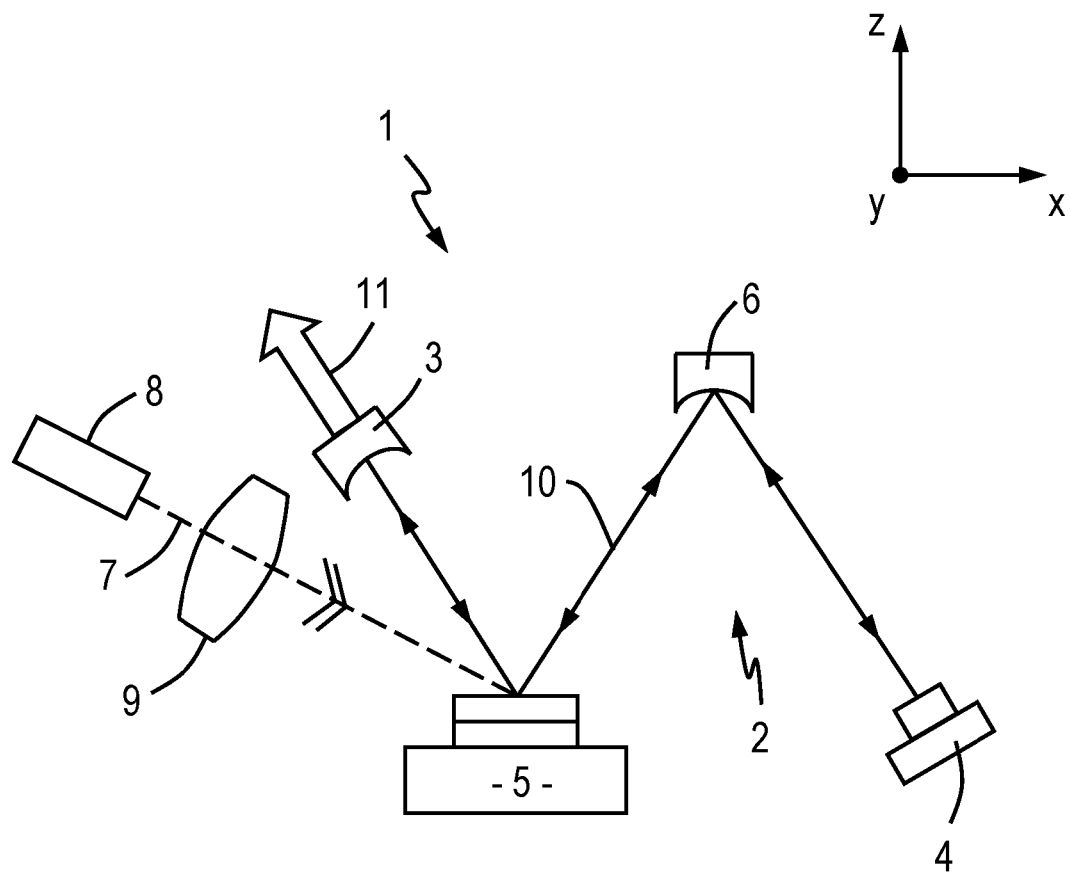
FIG. 1 presents a schematic representation of a passively mode-locking, semiconductor disk laser (SDL) in accordance with an embodiment of the present invention.

Referring initially to FIG. 1, a schematic representation of a passive mode-locking, semiconductor disk laser (SDL) 1 in accordance with an embodiment of the present invention is shown. For clarity of understanding axes are provided within this figure. The plane of the cavity referred to below is the plane defined by the x and z axes.

The passive mode-locking laser 1 can be seen to comprise a laser-resonator 2 formed between a first 3 and a second mirror 4 and includes a multilayer, optically-pumped, semiconductor disk laser (SDL) 5 further details of which are provided below with reference to FIGS. 2 and 3. As can be seen the SDL 5 is arranged to function as a first folding mirror for the resonator 2. A further folding mirrors 6 is included within the resonator 2 and so the resonator 2 can be considered to be a two times folded resonator.

The folding mirrors 6 is arranged to be highly reflective at a central wavelength $\lambda_o$ of the SDL 5 (for ease of understanding this is chosen to be 980 nm) while the first mirror 3 is partially reflective and partially transmissive at this central wavelength and so acts as an output coupler for the resonator 2.

The mirrors 4 and 6 may be mounted within piezo-electric controlled mirror mounts so as to provide a means for fine adjusting the alignment of these components. Furthermore, mirrors 3 and 6 are concave mirrors each having a radius of curvature of 200 mm while the mirrors 4 and the SDL 5 are substantially planar reflecting elements such that the resonator 2 is optically stable. In the embodiment of FIG. 1 a spacing of 150 mm is provided between each of the adjacent mirrors 3, 5, 6, and 4 of the resonator 2.

A continuous wave (cw) optical pumping field 7 suitable for pumping the SDL 5 is provided by employing a fibre coupled laser diode system 8. In the presently described embodiment the fibre coupled laser diode system 8 is configured to generate a cw optical pumping field 7 at 808 nm which is focussed onto a front surface of the SDL 5 by pump optics 9. A DILAS® M1F4S22-808 30C-SS2.1 is an example of one such suitable fibre coupled laser diode system 8. The pump optics 9 provide a means for controlling the size of the pumping field 7 on the front surface of the SDL 5.

As can be seen from FIG. 1, the fibre coupled laser diode system 8 is arranged to pump the gain medium 15 at an angle suitable for providing an elliptical pump spot at the surface of the gain medium 15. It will be appreciated by the skilled reader that the present invention is not so limited and that the fibre coupled laser diode system 8 could provide a pump field 7 that is perpendicular to the SDL 5 so as to provide a circular pump spot at the surface of the gain medium 15.

In FIG. 1 the intra cavity resonating field is depicted generally by reference numeral 10 while the ultra short pulsed output field from the laser resonator 2 is depicted generally by reference numeral 11.

Figure 2:
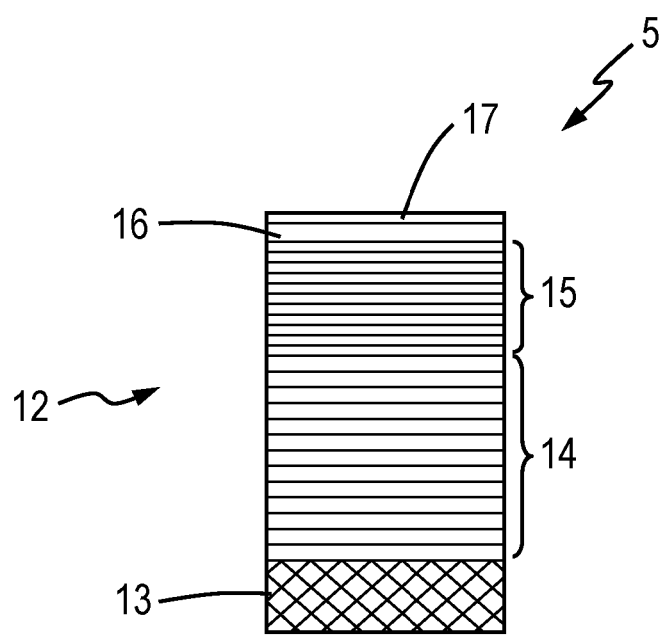
FIG. 2 presents a schematic representation of a semiconductor disk laser (SDL) employed by the laser of FIG. 1.

A schematic representation of the SDL 5 is presented in FIG. 2. The SDL 5 can be seen to comprise a wafer structure 12 that is grown by a metal-organic chemical vapour deposition (MOCVD) technique on a GaAs substrate 13. The deposition of the wafer structure may be achieved by alternative techniques known in the art e.g. molecular beam epitaxy (MBE) deposition techniques. The wafer structure 12 comprises a first distributed Bragg reflector (DBR) region 14, a gain medium 15, a carrier confinement potential barrier 16 and an oxidation prevention layer 17.

As is appreciated by those skilled in the art, there are many variations of the wafer structures 12 incorporated within SDLs and the present invention is not limited to use with any particular DBR 14 or gain medium 15 structure. In general, the gain medium 15 will comprise multiple quantum wells equally spaced between half-wave structures that allow the SDL 5 to be optically pumped at a convenient pump wavelength while the DBR 14 generally comprise multiple pairs of quarter-wave layers that exhibit high reflectivities at the desired wavelength for the output field 11.

By way of example only, the presently described embodiments comprise a gain medium 15 comprising InGaAs quantum wells equally spaced between half-wave GaAs structures that allow the SDL 5 to be optically pumped at 808 nm while generating an output at 980 nm.

The first DBR region 14 comprises thirty pairs of AlAs—GaAs quarter-wave layers that produce a reflectivity greater than 99.9% centred at 980 nm. The carrier confinement potential barrier 16 comprises a single wavelength-thick $Al_{0.3}Ga_{0.7}As$ layer. The oxidation prevention layer 17 may comprise a thin GaAs cap.

Alternative gain mediums known to those skilled in the art that may alternatively be used include alternative gallium arsenide (GaAs) structures capable of generating output wavelengths between 670 nm and 1300 nm; Indium Phosphide (InP) structures capable of generating output wavelengths between 1350 nm and 1600 nm; and Gallium Antimonide (GaSb) structures capable of generating output wavelengths between 1800 nm and 2700 nm. These gain mediums may be based on quantum wells or quantum dots as known to those skilled in the art.

Figure 3:
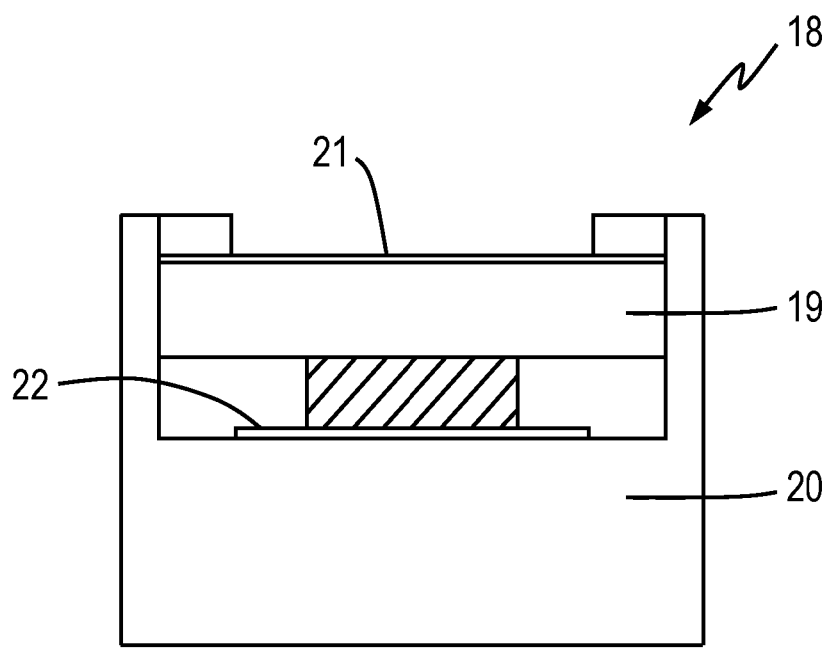
FIG. 3 present a schematic representation of a cooling apparatus employed in conjunction with the SDL of FIG. 2.

FIG. 3 presents further detail of a cooling apparatus 18 employed in order to improve the operating characteristics of the SDL 5. In particular, the cooling apparatus 18 comprises a heat spreader 19 and a standard thermoelectric or water cooler 20. The heat spreader 19 comprises a single diamond crystal that comprises an external, wedged face 21. A high performance anti-reflection coating may be deposited on the surface of the wedged face 21.

The single diamond crystal heat spreader 19 is bonded by optical contacting with the wafer structure 12 so that the gain medium 15 is located between the heat spreader 19 and the first DBR 14. The wafer structure 12 and heat spreader 19 are then fixed on top of a layer of indium foil 22 onto the thermoelectric or water cooler 20.

Figure 4:
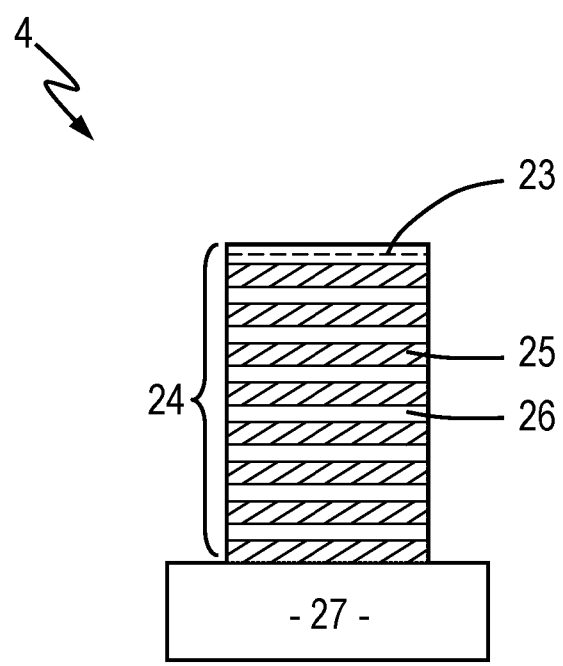
FIG. 4 presents a schematic representation of a saturable Bragg reflector (SBR) employed by the laser of FIG. 1.

Mirror 4 is an intensity saturable mirror and may comprise a saturable Bragg reflector (SBR) of the type described in detail within U.S. Pat. No. 5,627,854 and presented schematically in FIG. 4. In the presently described embodiment this component comprises a single quantum well 23 grown within a second distributed Bragg reflector (DBR) 24. The second DBR 24 can be seen to comprise eight pairs of AlAs 25 AlGaAs 26 quarter-wave layers mounted on a GaAs substrate 27 so as to produce a reflectivity greater than 99.9% over a reflectivity bandwidth ΔR of around 100 nm centred at 950 nm. With the above arrangement the free spectral range of (FSR) of the second distributed Bragg reflector (DBR) 24 is of the order of 300 nm. In an alternative embodiment the second DBR 24 may comprise as many as thirty pairs of AlAs 25 AlGaAs 26 quarter-wave layers.

As will be appreciated by those skilled in the art, temperature control of the intensity saturable mirror 4 is also necessary. This can be achieved by employing a standard thermoelectric or water cooler in a similar manner to that described above in relation to the SDL 5.

The above described resonator 2 is configured so as to ensure that the cross sectional area of the intra cavity resonating field 10 on the SBR 4 is greater than, or equal to, the cross sectional area of the intra cavity resonating field on the gain medium 15. As will be appreciated by the skilled reader, this arrangement is contrary to the normal practice adopted in the art, as described above, since such an arrangement is known to increase the effects of gain saturation.

In this configuration the SDL 1 begins to lase when the gain medium 15 is pumped by the pumping field 7 and the passively mode-locked output field 11 is thus generated. The mode locking is assisted by the employment of the intensity saturable mirror 4 since it acts to clip the leading edges of the intracavity pulses or cavity modes that form the resonator field 10. In addition, the gain saturation effects introduced by the relative cross sectional area of the intra cavity resonating field 10 on the SBR 4 and on the gain medium 15 also assist mode locking since these effects act to clip the trailing edge of these intracavity pulses or cavity modes.

An additional advantage is also achieved by employing a resonator 2 that results in larger cross sectional area of the intra cavity resonating field 10 on the SBR 4 when compared to those systems known in the art. This is because larger cross sectional area reduces the intensity of the intra cavity resonating field 10 on the SBR 4 so increasing its reliability.

The overall effect is to provide a passive mode-locking, semiconductor disk laser (SDL) 1, having pulse widths in the range of 100 ps down to a few femtoseconds, that also exhibit increased stability when compared to those systems known in the art.

Figure 5:
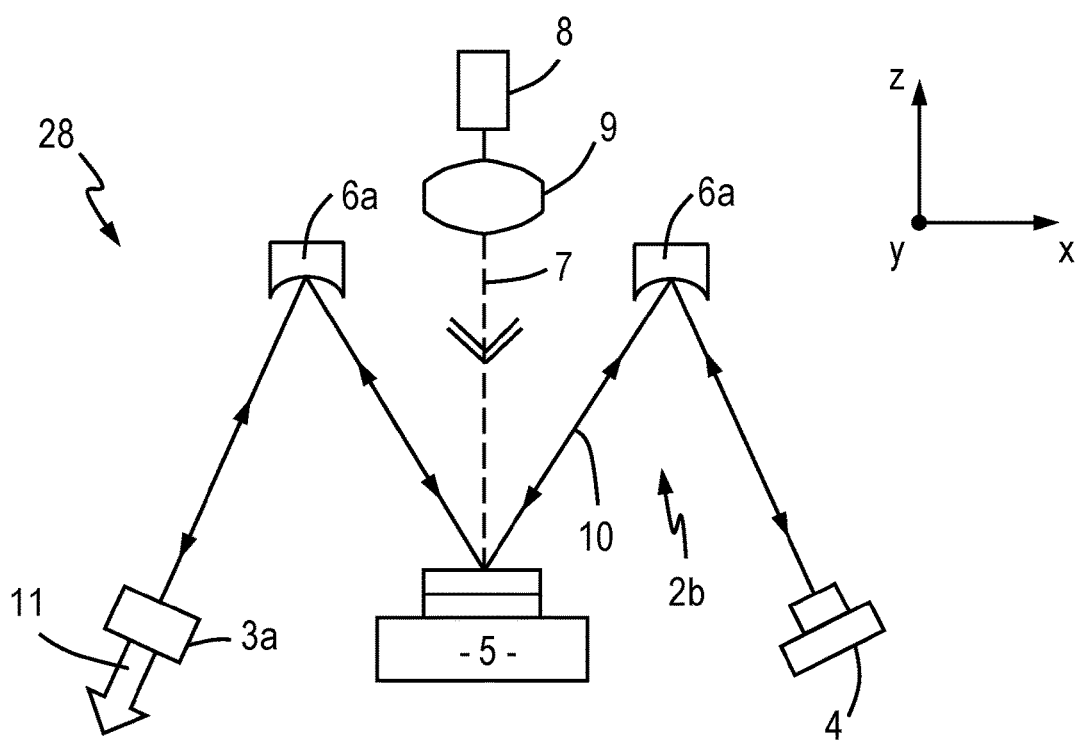
FIG. 5 presents a passively mode-locking, semiconductor disk laser (SDL) in accordance with an alternative embodiment of the present invention. In the description which follows, like parts are marked throughout the specification and drawings with the same reference numerals. The drawings are not necessarily to scale and the proportions of certain parts have been exaggerated to better illustrate details and features of embodiments of the invention.

FIG. 5 presents a schematic representation of a passive mode-locking, semiconductor disk laser (SDL) 28 in accordance with an alternative embodiment of the present invention, similar to the laser 1 presented in FIG. 1. In this embodiment the SDL 28 the resonator 2b is substantially M-shaped and is again formed between a first mirror (output coupler 3a) and a second mirror (SBR 4) and again includes a SDL 5. Located between the output coupler 3a and the SDL 5 is a folding mirror 6a. A similar folding mirror 6a is located between the SDL 5 and the SBR 4. The resonator 2b can therefore be considered to be a three times folded resonator.

In the presently described embodiment folding mirrors 6s are concave mirrors each having a radius of curvature of 200 mm while the mirror 4, the SDL 5 and the output coupler 3a are substantially planar reflecting elements such that the resonator 2b is optically stable. In the embodiment of FIG. 5 a spacing of 150 mm is provided between each of the adjacent mirrors 3a, 6a, 5, 6a, and 4 of the resonator 2b.

Significantly, the resonator 2b is again configured so as to ensure that the cross sectional area of the intra cavity resonating field 10 on the SBR 4 is greater than or equal to the cross sectional area of the intra cavity resonating field on the gain medium 15. The laser 28 thus operates in a similar manner to the laser described above with reference to FIGS. 1 to 4. The passively mode-locking SDL 28 of FIG. 5 has the advantage over the configuration shown in FIG. 1 in that it employs a planar output coupler 3a since such output coupler 3a are commercially easier to source.

It will be appreciated that a number of alternatives may be incorporated into the above described embodiments. For example the structure of the SDL 5 may be varied so as to provided alternative output wavelengths as required by the particular application for which the semiconductor laser is to be employed.

Furthermore, the size of the cross sectional area of the intra cavity resonating field 10 on the SBR 4 and on the gain medium 15 may be varied. What is important is that the cross sectional area of the intra cavity resonating field 10 on the SBR 4 is greater than or equal to the cross sectional area of the intra cavity resonating field on the gain medium 15.

The heat spreader may alternatively comprise materials other than single diamond crystal as long as the material employed exhibits the required heat spreading properties. Sapphire ($Al_2O_3$) and silicon carbide (SiC) are examples of alternative materials that may be employed to produce the heat spreader.

The presently described semiconductor laser systems can therefore be employed to generate a passively mode-locking output field having a pulse widths from 100 ps down to 100 fs, at wavelengths between 670 nm and 2700 nm and with power outputs ranging from 100 MW to 5 W.

A passively mode-locking laser and corresponding method is described. The laser comprises a resonator terminated by first and second mirrors and folded by a third and fourth mirror. The third mirror comprises a reflector surmounted by a multilayer semiconductor gain medium including at least one quantum well layer while the second mirror comprises an intensity saturable mirror. The resonator is configured to provide a cross sectional area of an intra cavity resonating field on the intensity saturable mirror that is greater than or equal to a cross sectional area of the intra cavity resonating field on the multilayer semiconductor gain medium. This arrangement provides a passively mode-locking laser that exhibits increased stability when compared to those systems known in the art.

Throughout the specification, unless the context demands otherwise, the terms "comprise" or "include", or variations such as "comprises" or "comprising", "includes" or "including" will be understood to imply the inclusion of a stated integer or group of integers, but not the exclusion of any other integer or group of integers.

Furthermore, reference to any prior art in the description should not be taken as an indication that the prior art forms part of the common general knowledge.

The foregoing description of the invention has been presented for purposes of illustration and description and is not intended to be exhaustive or to limit the invention to the precise form disclosed. The described embodiments were chosen and described in order to best explain the principles of the invention and its practical application to thereby enable others skilled in the art to best utilise the invention in various embodiments and with various modifications as are suited to the particular use contemplated. Therefore, further modifications or improvements may be incorporated without departing from the scope of the invention as defined by the appended claims.

The invention claimed is:

1. A passively mode-locking laser comprising:
   a resonator terminated by first and second mirrors and folded by third and fourth mirrors, the third mirror comprising a reflector surmounted by a multilayer semiconductor gain medium including at least one quantum well layer and the second mirror comprising an intensity saturable mirror,
   wherein the resonator is configured to provides a cross sectional area of an intra cavity resonating field on the intensity saturable mirror that is greater than or equal to a cross sectional area of the intra cavity resonating field on the multilayer semiconductor gain medium.

2. The passively mode-locking laser as claimed in claim 1 wherein the fourth mirror has a concave radius of curvature.

3. The passively mode-locking laser as claimed in claim 1 wherein the resonator is additionally folded by a fifth mirror, the fifth mirror being located between the first and third mirrors.

4. The passively mode-locking laser as claimed in claim 3 wherein the fifth mirror has a concave radius of curvature.

5. The passively mode-locking laser as claimed in claim 1 wherein the first mirror comprises an output coupler.

6. The passively mode-locking laser as claimed in claim 5 wherein the output coupler is planar.

7. The passively mode-locking laser as claimed in claim 5 wherein the output coupler has a concave radius of curvature.

8. The passively mode-locking laser as claimed in claim 1 wherein the laser further comprises a continuous wave (cw) optical field source the output from which is configured to pump the gain medium.

9. The passively mode-locking laser as claimed in claim 1 wherein the intensity saturable mirror comprises a saturable Bragg reflector (SBR).

10. The passively mode-locking laser as claimed in claim 1 wherein the laser provides an output field comprising ultra short pulses.

11. A method of passively mode-locking a laser the method comprising
    providing a resonator terminated by a first mirror and a second mirror comprising an intensity saturable mirror;
    folding the resonator with a third mirror and fourth mirror, the third mirror comprising a reflector surmounted by a multilayer semiconductor gain medium;
    configuring the resonator to provide a cross sectional area of an intra cavity resonating field on the intensity saturable mirror that is greater than or equal to a cross sectional area of the intra cavity resonating field on the multilayer semiconductor gain medium.

12. The method of passively mode-locking a laser as claimed in claim 11 wherein the method further comprises folding the resonator by providing a fifth mirror between the first and third mirrors.

13. The method of passively mode-locking a laser as claimed in claim 11 wherein the method further comprises providing a continuous wave (cw) optical field configured to pump the gain medium.

* * * * *